(12) United States Patent
Song et al.

(10) Patent No.: US 12,336,090 B2
(45) Date of Patent: *Jun. 17, 2025

(54) DISPLAY DEVICE

(71) Applicant: Samsung Display Co., LTD., Yongin-si (KR)

(72) Inventors: Seung Min Song, Gwangju (KR); Ki Nyeng Kang, Sejong-si (KR); Seon Beom Ji, Seoul (KR); Tae Hoon Yang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/235,937

(22) Filed: Aug. 21, 2023

(65) Prior Publication Data

US 2023/0397327 A1 Dec. 7, 2023

Related U.S. Application Data

(63) Continuation of application No. 16/917,416, filed on Jun. 30, 2020, now Pat. No. 11,770,893.

(30) Foreign Application Priority Data

Nov. 5, 2019 (KR) .......................... 10-2019-0140288

(51) Int. Cl.
| | |
|---|---|
| *H05K 1/02* | (2006.01) |
| *H05K 5/00* | (2006.01) |
| *H10K 50/844* | (2023.01) |
| *H10K 77/10* | (2023.01) |

(52) U.S. Cl.
CPC ......... *H05K 1/0277* (2013.01); *H05K 5/0017* (2013.01); *H10K 50/844* (2023.02); *H10K 77/111* (2023.02); *H05K 2201/055* (2013.01)

(58) Field of Classification Search
None
See application file for complete search history.

(56) References Cited

U.S. PATENT DOCUMENTS

| | | | |
|---|---|---|---|
| 9,349,969 B2 | 5/2016 | Kwon et al. | |
| 9,535,522 B2 | 1/2017 | Ahn | |
| 9,766,737 B2 | 9/2017 | Ahn | |
| 9,983,714 B2 | 5/2018 | Ahn | |

(Continued)

FOREIGN PATENT DOCUMENTS

| | | |
|---|---|---|
| EP | 3217447 | 9/2017 |
| KR | 1020140099174 A | 8/2014 |

(Continued)

OTHER PUBLICATIONS

Extended European Search Report—European Patent Application No. 20194224.0 dated Jan. 11, 2021, citing references listed within.

*Primary Examiner* — Anthony J Frost
(74) *Attorney, Agent, or Firm* — CANTOR COLBURN LLP

(57) ABSTRACT

A display device includes: a display panel including a bending area; and a first passivation film and a second passivation film disposed on a first surface of the display panel to be spaced apart from each other. The second passivation film includes a first flat portion and a first stepped portion overlapping the bending area, and a thickness of the first stepped portion is less than a thickness of the first flat portion.

17 Claims, 19 Drawing Sheets

(56) References Cited

U.S. PATENT DOCUMENTS

| | | | |
|---|---|---|---|
| D843,119 S | | 3/2019 | Zhu |
| 11,770,893 B2 * | | 9/2023 | Song ................. G02F 1/133305 |
| | | | 361/807 |
| 2014/0300529 A1 | | 10/2014 | Kim et al. |
| 2015/0124190 A1 * | | 5/2015 | Komatsu ............. G02F 1/13394 |
| | | | 349/46 |
| 2017/0062742 A1 * | | 3/2017 | Kim ..................... H10K 50/844 |
| 2017/0263887 A1 * | | 9/2017 | Han ..................... H10K 50/844 |
| 2017/0271616 A1 | | 9/2017 | Choi et al. |
| 2017/0352834 A1 * | | 12/2017 | Kim ................. G02F 1/133305 |
| 2018/0143482 A1 | | 5/2018 | Jin et al. |
| 2019/0094610 A1 | | 3/2019 | Yukawa et al. |
| 2020/0235339 A1 | | 7/2020 | Han et al. |

FOREIGN PATENT DOCUMENTS

| | | |
|---|---|---|
| KR | 1020170099944 A | 9/2017 |
| KR | 1020170116303 A | 10/2017 |
| KR | 1020180014292 A | 2/2018 |
| KR | 1020180018972 A | 2/2018 |
| KR | 1020190027412 A | 3/2019 |

* cited by examiner

DISPLAY DEVICE

This application is a continuation of U.S. patent application Ser. No. 16/917,416, filed on Jun. 30, 2020, which claims priority to Korean Patent Application No. 10-2019-0140288, filed on Nov. 5, 2019, and all the benefits accruing therefrom under 35 U.S.C. § 119, the content of which in its entirety is herein incorporated by reference.

BACKGROUND

1. Field

The disclosure relates to a display device.

2. Description of the Related Art

As various display devices such as mobile phones, tablet personal computers ("PC"s), laptop computers, computer monitors, and televisions ("TV"s) are more widely used in various fields, a demand for display devices having improved quality is also increasing.

In a display device, the quality desired to improve may include high resolution of the screen, and reduced power consumption. In a case of a portable display device, it may be desired to reduce weight to facilitate portability and to ensuring visibility when used outside.

SUMMARY

In a display device, efforts to reduce peripheral areas corresponding to areas other than the display area in a screen portion of the display device have been made to display images across the entire screen. When the display area is define on the entire surface of the display device, it may be easier to implement a single large screen by connecting a plurality of display devices, and it may be effectively applied to displays of various operating methods such as transparent displays or foldable displays, and it may also be applied to various fields.

However, the peripheral area includes components such as circuit wires, connection pads, and driving chips that are connected to the outside to supply electrical signals and power to the display area, so that the peripheral area may not be completely removed from the display panel or separated from the display area.

Embodiments have been made in an effort to provide a display device in which a bending area of a display panel is effectively protected by including a passivation film disposed in the bending area of the display panel and a stress applied to the display panel is relieved when bending.

An embodiment provides a display device including: a display panel including a bending area; and a first passivation film and a second passivation film, which are disposed on a first surface of the display panel to be spaced apart from each other, where the second passivation film includes a first flat portion and a first stepped portion overlapping the bending area, and a thickness of the first stepped portion is less than a thickness of the first flat portion.

In an embodiment, the display panel may further include a first flat area and a second flat area which are adjacent to the bending area, the bending area may include: a first bending area adjacent to the first flat area; a second bending area that is adjacent to the second flat area; and a third bending area adjacent to the first bending area and the second bending area, the first bending area may extend from the first flat area to bend in a first direction, the second bending area may extend from the second flat area to bend in the first direction, and the third bending area may be bent to connect the first bending area and the second bending area.

In an embodiment, the first stepped portion of the second passivation film may overlap the second bending area.

In an embodiment, the first stepped portion may include an inclined surface which is inclined with respect to the first surface of the display panel.

In an embodiment, the first stepped portion may include a first portion adjacent to the first flat portion and a second portion adjacent to the first portion, the thickness of the first flat portion may be greater than a thickness of the first portion, and the thickness of the first portion may be greater than a thickness of the second portion.

In an embodiment, the first passivation film may overlap the first flat area and the first bending area.

In an embodiment, the display panel may further include a first flat area and a second flat area which are adjacent to the bending area, the first passivation film may include a second flat portion overlapping the first flat area and a second stepped portion overlapping the bending area, and a thickness of the second stepped portion may be less than a thickness of the second flat portion.

In an embodiment, the second stepped portion may include an inclined surface that is inclined with respect to the first surface of the display panel.

In an embodiment, the second stepped portion may include a first portion adjacent to the first flat portion and a second portion adjacent to the first portion, the thickness of the first flat portion may be greater than a thickness of the first portion, and the thickness of the first portion may be greater than a thickness of the second portion.

In an embodiment, the display panel may further include a fourth bending area extending from the first flat area and bending in the first direction.

In an embodiment, the display device may further include a window positioned on the display panel.

In an embodiment, the second passivation film may include a second lower passivation film and a second upper passivation film disposed between the second lower passivation film and the display panel, the second upper passivation film and the second lower passivation film may include different materials from each other, and a width of the second upper passivation film may be greater than a width of the second lower passivation film.

In an embodiment, the display device may further include a protective cover disposed on a rear surface of the first passivation film and the second passivation film, and the protective cover may include a first protrusion positioned in an area corresponding to the third bending area and a second protrusion positioned in an area corresponding to the second bending area.

In an embodiment, the display device may further include a bendable portion passivation layer disposed on a second surface facing the first surface of the display panel, and the bendable portion passivation layer may overlap the third bending area.

In an embodiment, the display device may further include a bendable portion passivation layer disposed on a second surface facing the first surface of the display panel, and the bendable portion passivation layer may overlap the third bending area and the first stepped portion of the second passivation film.

An embodiment provides a display device including: a display panel configured to include a first flat area, a second flat area, and a bending area positioned between the first flat area and the second flat area; and a passivation film disposed on a first surface of the display panel, where the bending area includes: a first bending area which extends from the first flat area to bend in a first direction; a second bending area which extends from the second flat area to bend in the first direction; and a third bending area which connects the first bending area and the second bending area, the passivation film includes a stepped portion overlapping the bending area and a flat portion overlapping the second flat area, and a thickness of the stepped portion is less than a thickness of the flat portion.

In an embodiment, the passivation film may include a first passivation film overlapping the first flat area and the first bending area, and a second passivation film overlapping the second flat area and the second bending area, and the stepped portion may be defined by a portion of the second passivation film overlapping the second bending area.

In an embodiment, the passivation film may further include a third passivation film which is connected to the first passivation film and the second passivation film to overlap the third bending area, and a thickness of the third passivation film may be less than the thickness of the stepped portion.

In an embodiment, an open portion may be defined between the first passivation film and the second passivation film to expose the display panel. In an embodiment, the display panel may further include a display area, and the display area may be positioned in the first flat area and the first bending area.

According to embodiments of the invention, the display panel may be protected by including the passivation film disposed in the bending area of the display panel, such that the durability of the display device may be improved. In such embodiments, the stress applied to the display panel during bending may be reduced, and defects of the display device due to cracks in the wires and the like disposed in the bending area may be effectively prevented, by adjusting the thickness or position of the passivation film disposed in the bending area.

DETAILED DESCRIPTION

Figure 1:
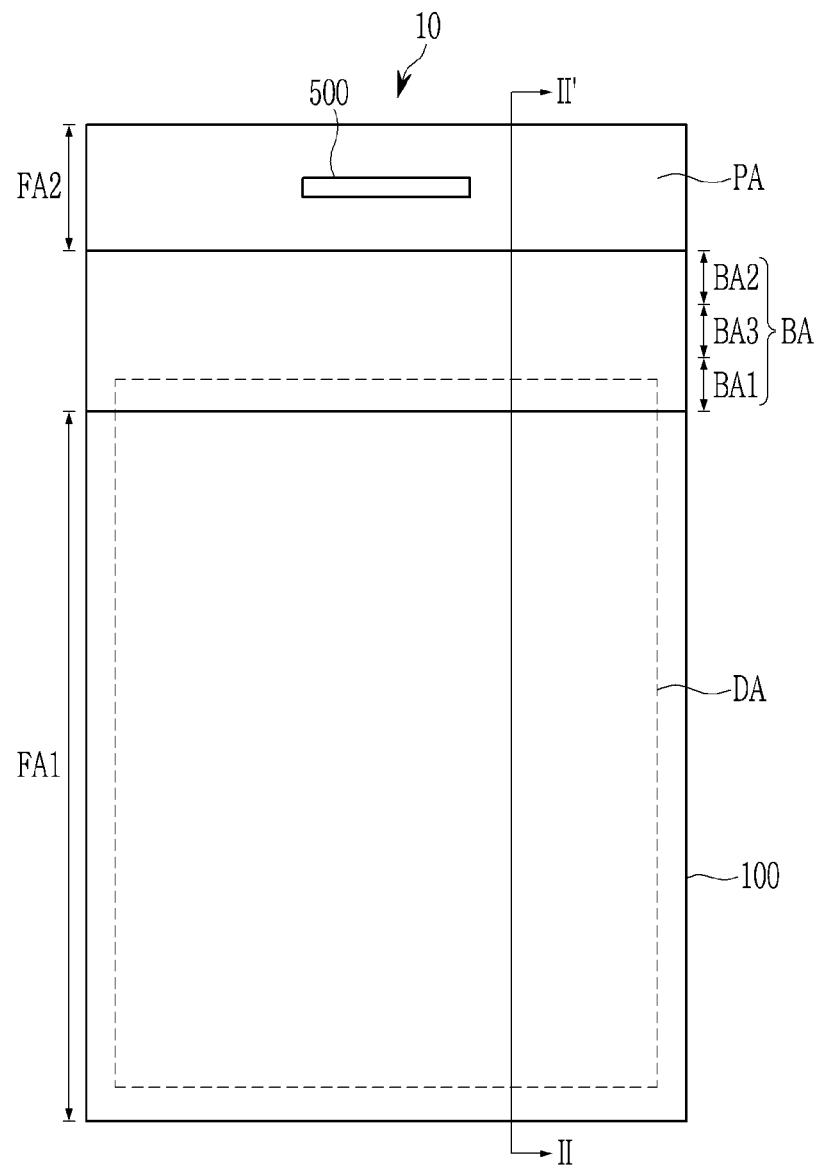
FIG. 1 illustrates a top plan view of a display device according to an embodiment.

The invention will be described more fully hereinafter with reference to the accompanying drawings, in which embodiments of the invention are shown. As those skilled in the art would realize, the described embodiments may be modified in various different ways, all without departing from the spirit or scope of the present invention.

To clearly describe embodiments of the invention, parts that are irrelevant to the description are omitted, and like numerals refer to like or similar constituent elements throughout the specification.

Further, since sizes and thicknesses of constituent elements shown in the accompanying drawings are arbitrarily given for better understanding and ease of description, the invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the word "over" or "on" means positioning on or below the object portion, and does not necessarily mean positioning on the upper side of the object portion based on a gravity direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Further, in the specification, the phrase "in a plan view" means when an object portion is viewed from above, and the phrase "in a cross-sectional view" means when a cross-section taken by vertically cutting an object portion is viewed from the side.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

First, a display device 10 according to an embodiment will be described with reference to FIG. 1 to FIG. 3.

FIG. 1 illustrates a top plan view of a display device according to an embodiment. FIG. 2 illustrates a cross-sectional view taken along line II-II' of FIG. 1. FIG. 3 illustrates a cross-sectional view showing a display device in a bent state according to an embodiment.

Referring to FIG. 1, an embodiment of the display device 10 includes a display panel 100. The display panel 100 includes a display area DA for displaying an image and a peripheral area PA positioned around the display area DA.

The display area DA of the display panel 100 may include a plurality of pixels, and may include a gate line and a data line connected to the pixels to transfer a signal. The display area DA of the display panel 100 may display an image in an upper surface direction of the display panel 100.

A driver 500 is positioned in the peripheral area PA of the display panel 100. The driver 500 may have a form of a chip on film ("COF"), and may be connected to the display area DA. In an embodiment, the display device 10 may further include a printed circuit board (not illustrated) connected to the driver 500. The driver 500 may receive a driving signal from the printed circuit board, and may supply the driving signal to the display area DA.

The display panel 100 includes a bending area BA, and a first flat area FA1 and a second flat area FA2 at opposite sides of the bending area BA. The bending area BA may be disposed between the first flat area FA1 and a second flat area FA2. The display panel 100 may be bent in the bending area BA. The display area DA is positioned in the first flat area FA1, and at least a portion of the display area DA is positioned in the bending area BA. In such an embodiment, the display area DA and the bending area BA may overlap each other The second flat area FA2 is positioned in the peripheral area PA, and the driver 500 is positioned in the second flat area FA2.

The bending area BA may include a first bending area BA1 that is adjacent to the first flat area FA1, a second bending area BA2 that is adjacent to the second flat area FA2, and a third bending area BA3 positioned between the first bending area BA1 and the second flat area FA2. The first bending area BA1, the second bending area BA2, and the third bending area BA3 may be bent in different directions, respectively, which will be described later.

The display panel 100 may include a substrate (not illustrated), and the substrate may be a flexible substrate including or made of a plastic material having high heat resistance and durability, such as polyethylene naphthalate ("PEN"), polycarbonate ("PC"), polyarylate ("PAR"), polyether imide ("PEI"), polyether sulfone ("PES"), polyimide ("PI"), or poly(methylmethacrylate) ("PMMA"). In such an embodiment, the invention is not limited thereto, and alternatively, the substrate of the display panel 100 may include at least one material selected from various flexible materials.

Figure 2:
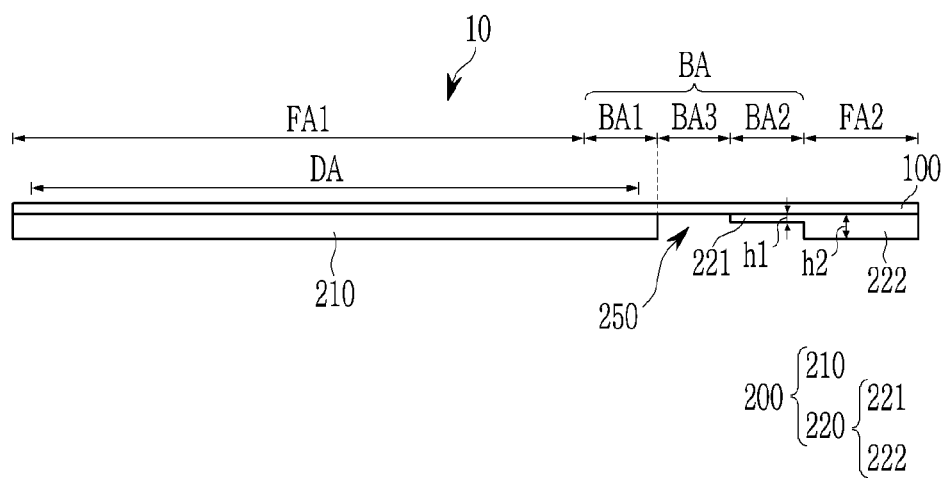
FIG. 2 illustrates a cross-sectional view taken along line II-II' of FIG. 1.

Referring to FIG. 2, in an embodiment, a passivation film 200 is disposed on a first surface (rear surface) of the display panel 100. The passivation film 200 is attached to the first surface of the display panel 100 to prevent foreign substances such as air and moisture from penetrating into display elements from the outside, and to protect the display panel 100 from external impact. The passivation film 200 may include a material such as an acryl-based compound, polyethylene terephthalate ("PET"), and PI.

The passivation film 200 includes a first passivation film 210 overlapping the display area DA of the display panel 100, and a second passivation film 220 that is spaced apart from the first passivation film 210 and overlapping the peripheral area PA of the display panel 100.

The first passivation film 210 overlaps the first flat area FA1 and the first bending area BA1 of the display panel 100. The second passivation film 220 overlaps the second flat area FA2 and the second bending area BA2 of the display panel 100. An open portion 250, in which the passivation film 200 is not disposed, is defined between the first passivation film 210 and the second passivation film 220 in an area overlapping the third bending area BA3 of the display panel 100. In such an embodiment, the passivation film 200 does not overlap the third bending area BA3.

The second passivation film 220 includes a stepped portion 221 overlapping the second bending area BA2 and a flat portion 222 overlapping the second flat area FA2.

In an embodiment, as shown in FIG. 2, a thickness h1 of the stepped portion 221 of the second passivation film 220 is less than a thickness h2 of the flat portion 222 of the second passivation film 220. Upper surfaces of the stepped portion 221 and the flat portion 222 are attached to the display panel 100. The upper surface of the stepped portion 221 attached to the display panel 100 and a lower surface of the stepped portion 221 facing the upper surface may be parallel to each other or on a same plane.

In an embodiment, the passivation film 200 may be formed by attaching a film to the rear surface of the display panel 100 and then irradiating a laser to form the open portion 250 and the stepped portion 221. In such an embodiment, a halftone mask may be used to form the stepped portion 221 having different thicknesses.

Figure 3:
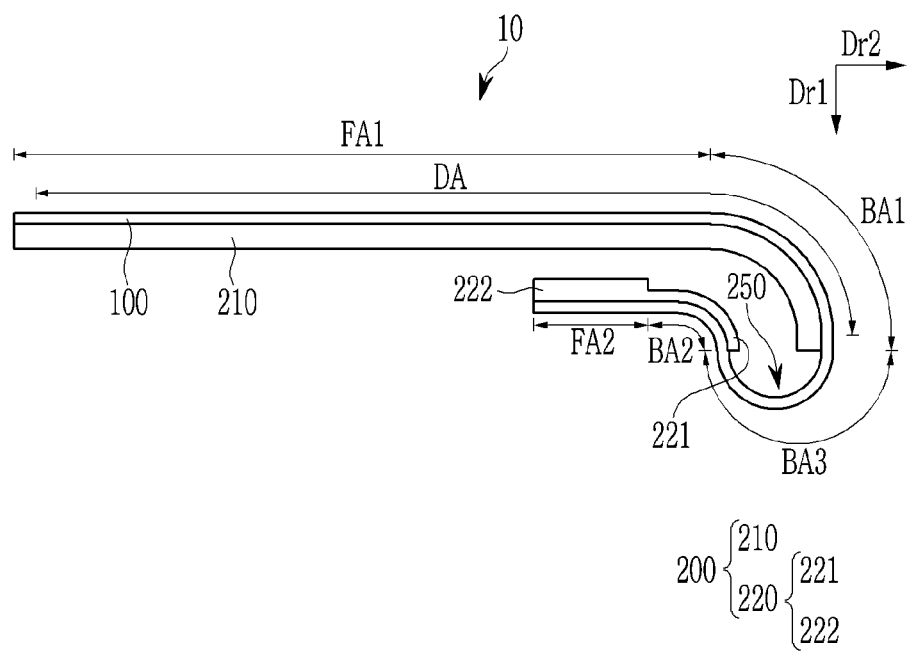
FIG. 3 illustrates a cross-sectional view of a display device in a bent state according to an embodiment.

Referring to FIG. 3, the first bending area BA1 of the display panel 100 extends from the first flat area FA1, and is bent in a first direction Dr1. Accordingly, the first passivation film 210 is also bent in the first direction Dr1 together with the first bending area BA1. In such an embodiment, the first direction Dr1 may be a direction crossing a second direction Dr2, which is a direction in which the first flat area FA1 extends. Alternatively, the first direction Dr1 may be a direction toward the rear surface of the display device 10.

The display area DA is also positioned in the first flat area FA1 and the first bending area BA1. Accordingly, an image may be displayed not only in the direction toward a front surface of the display device 10 but also at an edge and a side of the display device 10 in which the display panel 100 is bent, and the exposure of the peripheral area PA to the user may be minimized.

The second flat area FA2 of the display panel 100 overlaps the first flat area FA1, and the first flat area FA1 and the second flat area FA2 are disposed in parallel with each other. The second bending area BA2 extends from the second flat area FA2, and is bent in the first direction Dr1. Accordingly, the stepped portion 221 of the second passivation film 220 is also bent in the first direction Dr1 together with the second bending area BA2.

The third bending area BA3 is bent to connect the first bending area BA1 and the second bending area BA2. The third bending area BA3 may have a U-like shape.

In an embodiment, the display device 10 may include the stepped portion 221 of the second passivation film 220 overlapping the second bending area BA2, and thus the second bending area BA2 of the display panel 100 may be protected, and durability of the display panel 100 may be improved.

In such an embodiment, since the thickness h1 of the stepped portion 221 of the second passivation film 220 is thinner than the thickness h2 of the flat portion 222 overlapping the second flat area FA2, the stress applied to the display panel 100 by the passivation film 200 during bending may be reduced.

Hereinafter, the display device 10 according to an alternative embodiment will be described with reference to FIG. 4.

Figure 4:
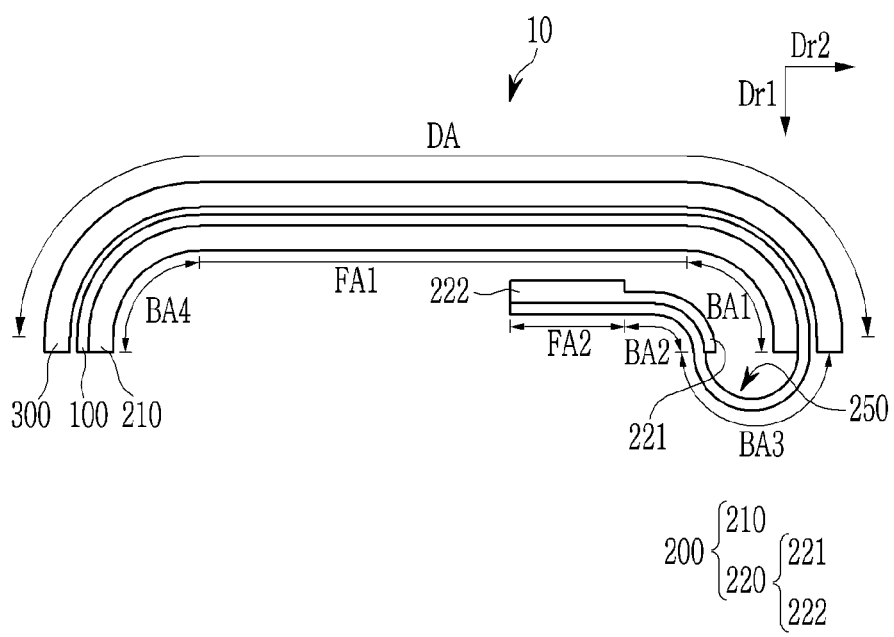
FIG. 4 illustrates a cross-sectional view of a display device according to an embodiment.

FIG. 4 illustrates a cross-sectional view of a display device according to an embodiment.

An embodiment of the display device 10 may include a display panel 100, a passivation film 200 disposed on a first surface (rear surface) of the display panel 100, and a window 300 disposed on a second surface (front surface) of the display panel 100.

In an embodiment, the display panel 100 includes a first flat area FA1 and a second flat area FA2, and a first bending area BA1, a second bending area BA2, and a third bending area BA3 positioned between the first flat area FA1 and the second flat area FA2. In such an embodiment, the display panel 100 further includes a fourth bending area BA4 adjacent to the first flat area FA1. The first flat area FA1 is positioned between the first bending area BA1 and the fourth bending area BA4. The first bending area BA1 may extend from a first end of the first flat area FA1 to bend in the first direction Dr1, which is a rear direction of the display panel 100, and the fourth bending area BA4 may extend from a second end of the first flat area FA1 to bend in the first direction Dr1. In this case, the display area DA is also positioned in the first flat area FA1, the first bending area BA1, and the fourth bending area BA4.

In an embodiment, the display device 10 includes the passivation film 200 positioned on the rear surface of the display panel 100. The passivation film 200 includes a first passivation film 210 that is overlapped with the display area DA of the display panel 100, and a second passivation film 220 that is spaced apart from the first passivation film 210 and overlaps the peripheral area PA. The first passivation film 210 overlaps the first flat area FA1, the first bending area BA1, and the fourth bending area BA4 of the display panel 100. The second passivation film 220 overlaps the second flat area FA2 and the second bending area BA2 of the display panel 100.

The window 300 is positioned on the display panel 100, and may include a glass or a plastic resin. The window 300 may be positioned on the display panel 100 to protect the display panel 100. The window 300 may include a transparent material.

Hereinafter, the display device 10 according to another alternative embodiment will be described with reference to FIG. 5.

Figure 5:
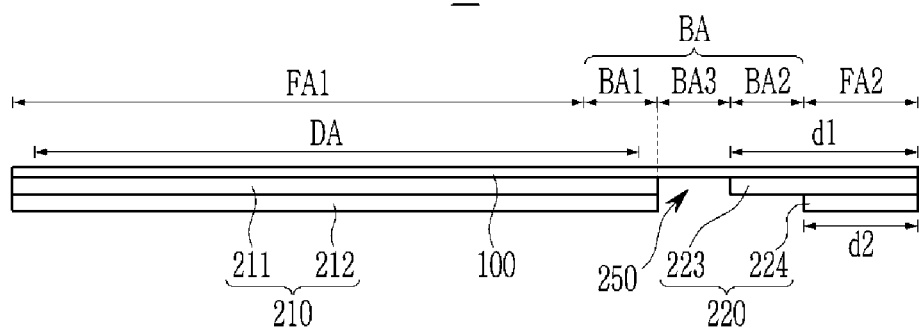
FIG. 5 illustrates a cross-sectional view of a display device according to an embodiment.

FIG. 5 illustrates a cross-sectional view of a display device according to an embodiment. More particularly, FIG. 5 illustrates an embodiment of a display device in an unfolded state in which the display device 10 is not bent.

An embodiment of the display device 10 includes a display panel 100 and a passivation film 200 positioned on a first surface (rear surface) of the display panel 100.

The passivation film 200 includes a first passivation film 210 that is overlapped with the display area DA of the display panel 100, and a second passivation film 220 that is spaced apart from the first passivation film 210 and overlaps the peripheral area PA.

The first passivation film 210 includes a first upper passivation film 213 and a first lower passivation film 214 overlapping each other in a thickness direction of the display panel 100. The first upper passivation film 213 is attached to the rear surface of the display panel 100, and is positioned between the display panel 100 and the first lower passivation film 214. The first upper passivation film 213 and the first lower passivation film 214 also overlap the first flat area FA1 and the first bending area BA1 of the display panel 100. The first upper passivation film 213 and the first lower passivation film 214 may include different materials from each other.

The second passivation film 220 includes a second upper passivation film 223 and a second lower passivation film 224 overlapping each other in a thickness direction of the display panel 100. The second upper passivation film 223 is attached to the rear surface of the display panel 100, and is positioned between the display panel 100 and the second lower passivation film 224. The second upper passivation film 223 overlaps the second flat area FA2 and the second bending area BA2 of the display panel 100. The second lower passivation film 224 overlaps the second flat area FA2, and is not positioned in an area overlapping the second bending area BA2. A width d1 of the second upper passivation film 223 is greater than a width d2 of the second lower passivation film 224. The second upper passivation film 223 and the second lower passivation film 224 may include different materials from each other.

Hereinafter, the display device 10 according to another alternative embodiment will be described with reference to FIG. 6.

Figure 6:
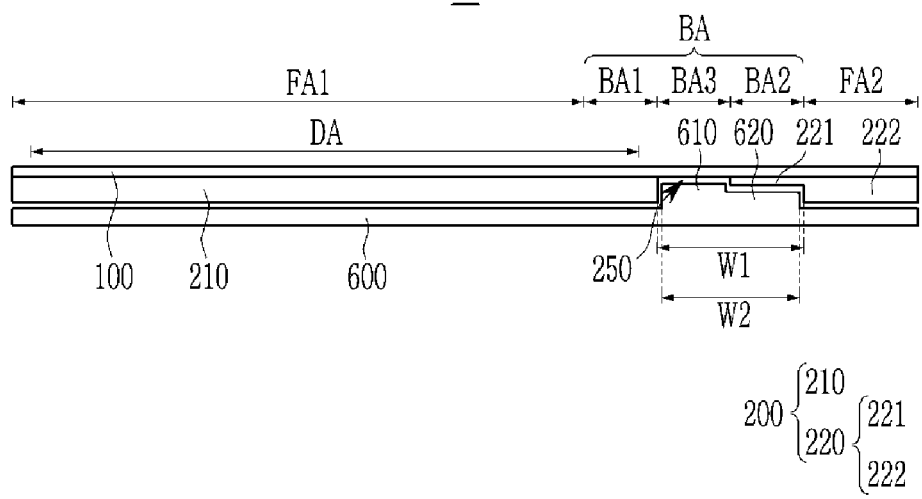
FIG. 6 illustrates a cross-sectional view of a display device according to an embodiment.

FIG. 6 illustrates a cross-sectional view of a display device according to an embodiment. More particularly, FIG. 6 illustrates a display device in an unfolded state in which the display device 10 is not bent.

An embodiment of the display device 10 includes a display panel 100 and a passivation film 200 positioned on a first surface (rear surface) of the display panel 100.

The passivation film 200 includes a first passivation film 210 overlapping the display area DA of the display panel 100, and a second passivation film 220 that is spaced apart from the first passivation film 210 and overlapping the peripheral area PA.

The first passivation film 210 overlaps the first flat area FA1 and the first bending area BA1 of the display panel 100. The second passivation film 220 overlaps the second flat area FA2 and the second bending area BA2 of the display panel 100. The second passivation film 220 includes a stepped portion 221 overlapping the second bending area BA2 and a flat portion 222 overlapping the second flat area FA2. An open portion 250, in which the passivation film 200 is not disposed, is defined in an area overlapping the third bending area BA3 of the display panel 100.

A protective cover 600 is disposed on a rear surface of the passivation film 200.

The protective cover 600 includes a first protrusion 610 disposed in an area corresponding to the third bending area BA3 and a second protrusion 620 disposed in an area corresponding to the second bending area BA2.

A width W1 of the second bending area BA2 and the third bending area BA3 is greater than a width W2 of the first protrusion 610 and the second protrusion 620. Accordingly, corners of the protective cover 600 and the passivation film 200 may be spaced apart from each other, and damage to the display device 10 due to a collision or friction between the protective cover 600 and the passivation film 200 may be effectively prevented.

Hereinafter, the display device 10 of the display device according to another alternative embodiment will be described with reference to FIG. 7 and FIG. 8.

Figure 7:
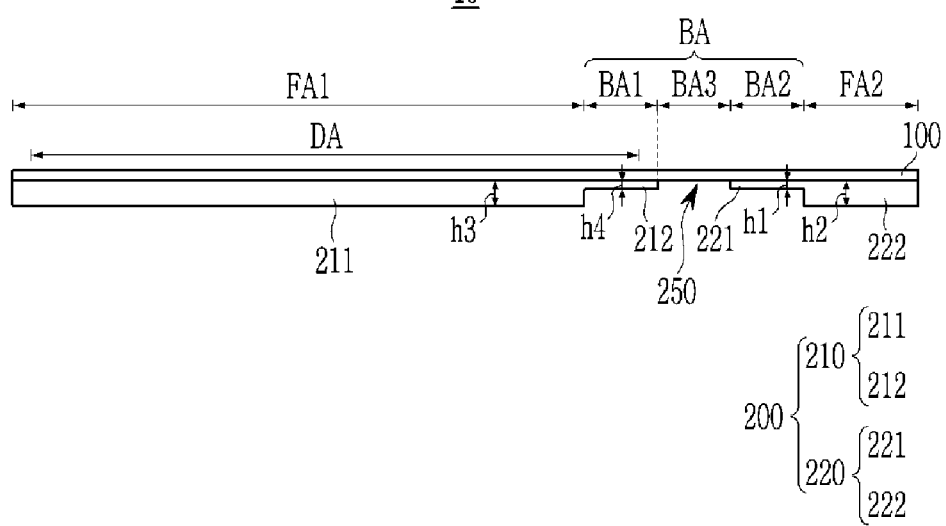
FIG. 7 illustrates a cross-sectional view of a display device according to an embodiment.
Figure 8:
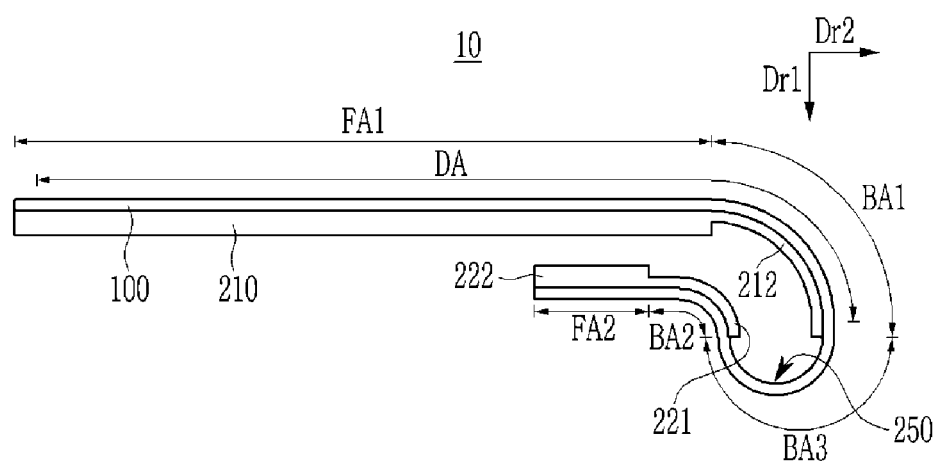
FIG. 8 illustrates a cross-sectional view of a display device according to an embodiment.

FIG. 7 and FIG. 8 illustrate cross-sectional views of a display device according to an embodiment. FIG. 7 illustrates the display device 10 in an unfolded state according to the embodiment, and FIG. 8 illustrates the display device 10 of FIG. 7 in a bent state. The display device shown in FIG. 7 and FIG. 8 is substantially the same as the display device shown in FIG. 2 and FIG. 3 except that the first passivation film 210 includes a second flat portion 211 and a second stepped portion 212. The same or like elements shown in FIG. 7 and FIG. 8 8 have been labeled with the same reference characters as used above to describe the embodiment of the display device shown in FIG. 2 and FIG. 3, and any repetitive detailed description thereof will hereinafter be omitted or simplified.

In an embodiment, the display device 10 includes a display panel 100 and a passivation film 200 positioned on a rear surface of the display panel 100.

The passivation film 200 includes a first passivation film 210 overlapping the display area DA of the display panel 100, and a second passivation film 220 that is spaced apart from the first passivation film 210 and overlapping the peripheral area PA.

The first passivation film 210 includes the second flat portion 211 overlapping the first flat area FA1 of the display panel 100 and the second stepped portion 212 overlapping the first bending area BA1. A thickness h4 of the second stepped portion 212 is less than a thickness h3 of the second flat portion 211. In such an embodiment, the display device 10 may reduce the stress applied to the display panel 100 by the passivation film 200 during bending by reducing the thickness of the passivation film 200 in the area overlapping the first bending area BA1.

The second passivation film 220 includes a first stepped portion 221 overlapping the second bending area BA2 and a first flat portion 222 overlapping the second flat area FA2.

Hereinafter, the display device 10 according to another alternative embodiment will be described with reference to FIG. 9 and FIG. 10.

Figure 9:
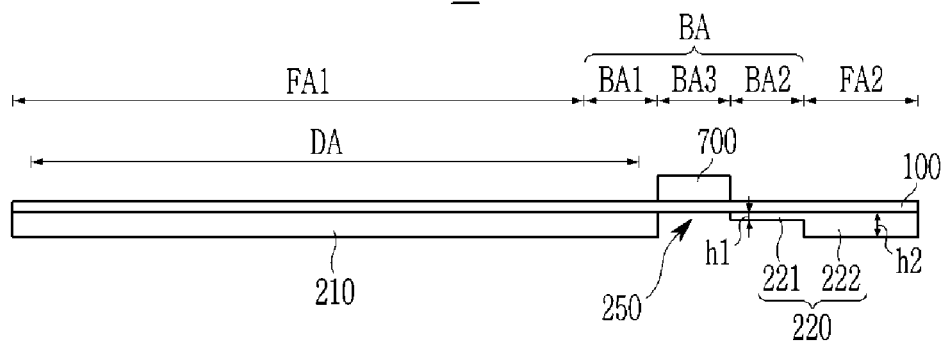
FIG. 9 illustrates a cross-sectional view of a display device according to an embodiment.
Figure 10:
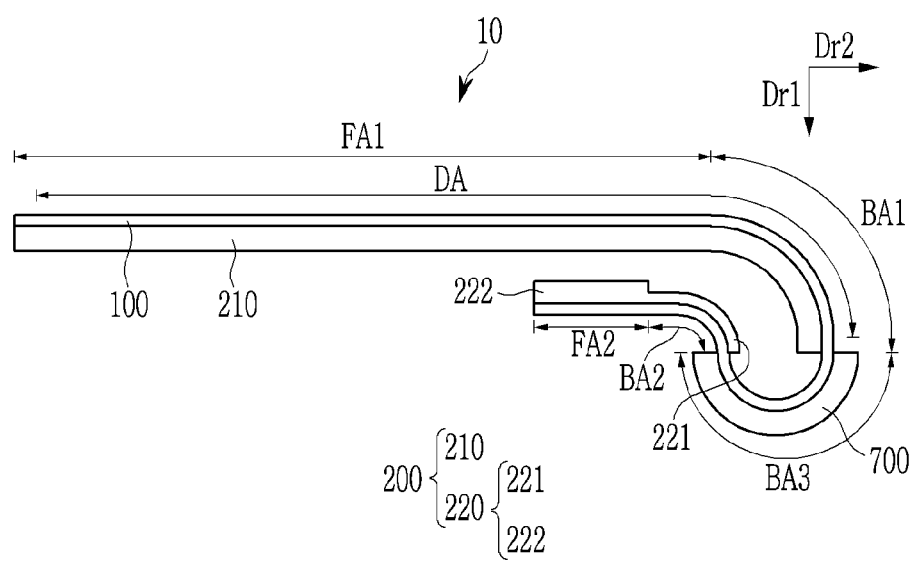
FIG. 10 illustrates a cross-sectional view of a display device according to an embodiment.

FIG. 9 and FIG. 10 illustrate cross-sectional views of a display device according to an embodiment.

In an embodiment, the display device 10 includes a display panel 100, a passivation film 200 positioned on a first surface (rear surface) of the display panel 100, and a bendable portion passivation layer 700 positioned on a second surface (upper surface) of the display panel 100.

The passivation film 200 includes a first passivation film 210 overlapping the display area DA of the display panel 100, and a second passivation film 220 that is spaced apart from the first passivation film 210 and overlapping the peripheral area PA.

The first passivation film 210 overlaps the first flat area FA1 and the first bending area BA1 of the display panel 100. The second passivation film 220 overlaps the second flat area FA2 and the second bending area BA2 of the display panel 100.

The second passivation film 220 includes a stepped portion 221 overlapping the second bending area BA2 and a flat portion 222 overlapping the second flat area FA2.

The bendable portion passivation layer 700 overlaps the third bending area BA3 of the display panel 100, and is disposed on the second surface (upper surface) of the display panel 100. The bendable portion passivation layer 700 overlaps the third bending area BA3 of the display panel 100 to relieve a stress on a wire (not illustrated) disposed in the third bending area BA3 of the display panel 100 when bending, and cracks may be effectively prevented from occurring in the wire.

Hereinafter, the display device 10 according to another alternative embodiment will be described with reference to FIG. 11.

Figure 11:
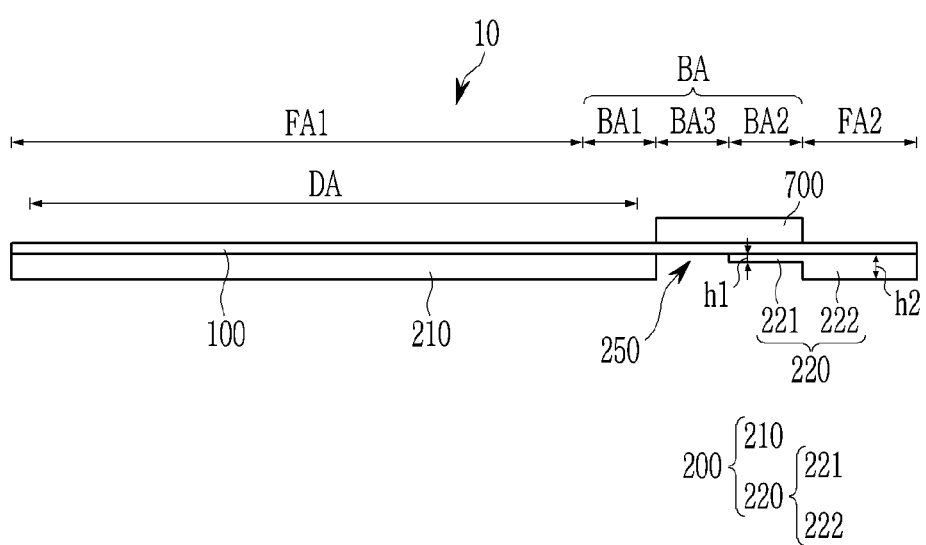
FIG. 11 illustrates a cross-sectional view of a display device according to an embodiment.

FIG. 11 illustrates a cross-sectional view of a display device according to an embodiment.

In an embodiment, the display device 10 includes a display panel 100, a passivation film 200 positioned on the rear surface of the display panel 100, and a bendable portion passivation layer 700 positioned on the upper surface of the display panel 100.

In such an embodiment, as shown in FIG. 11, the bendable portion passivation 700 overlaps the second bending area BA2 and the third bending area BA3 of the display panel 100, and is disposed on the second surface (upper surface)

of the display panel 100. The bendable portion passivation layer 700 overlaps the stepped portion 221 of the second passivation film 220.

Hereinafter, the display device 10 according to another alternative embodiment will be described with reference to FIG. 12.

Figure 12:
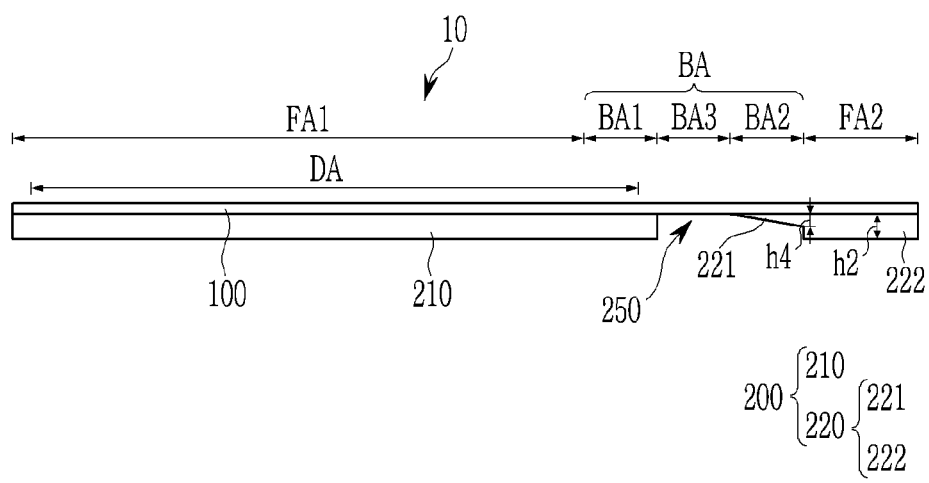
FIG. 12 illustrates a cross-sectional view of a display device according to an embodiment.

FIG. 12 illustrates a cross-sectional view of a display device according to an embodiment.

In an embodiment, the display device 10 includes a display panel 100 and a passivation film 200 positioned on a first surface (rear surface) of the display panel 100.

The passivation film 200 includes a first passivation film 210 overlapping the display area DA of the display panel 100, and a second passivation film 220 that is spaced apart from the first passivation film 210 and overlapping the peripheral area PA.

The second passivation film 220 includes a stepped portion 221 overlapping the second bending area BA2 and a flat portion 222 overlapping the second flat area FA2. The lower surface of the stepped portion 221 includes an inclined surface that is inclined with respect to the first surface (rear surface) of the display panel 100. A thickness of the stepped portion 221 may gradually decrease from a portion adjacent to the flat portion 222 to a portion adjacent to the third bending area BA3.

A maximum thickness h4 of the stepped portion 221 is less than the thickness h2 of the flat portion 222. As the inclined stepped portion 221 of the second passivation film 220 approaches the third bending area BA3 having a smallest radius of curvature in an area overlapping the second bending area BA2, the thickness of the second passivation film 220 may gradually decrease, and the stress applied to the display panel 100 during bending may be reduced.

Hereinafter, the display device 10 according to another alternative embodiment will be described with reference to FIG. 13.

Figure 13:
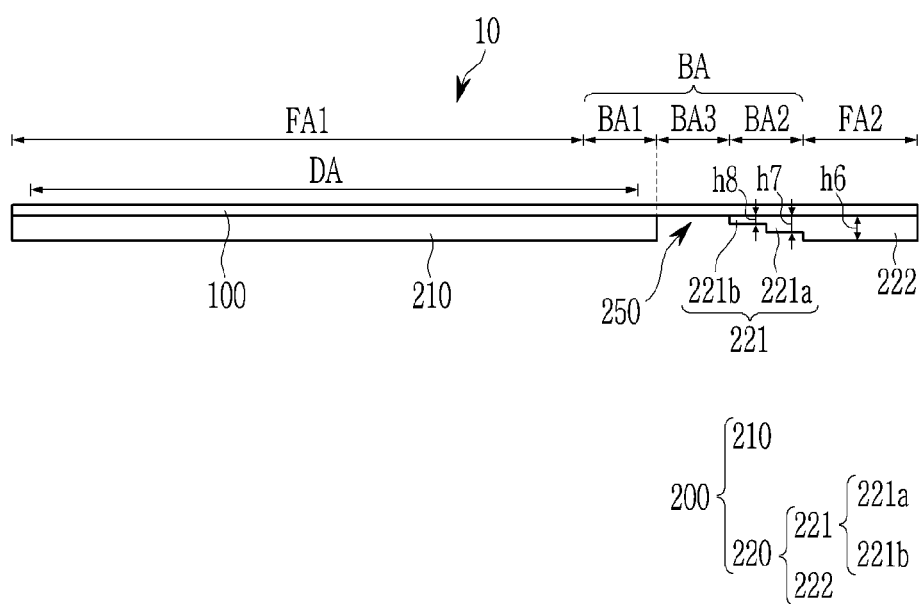
FIG. 13 illustrates a cross-sectional view of a display device according to an embodiment.

FIG. 13 illustrates a cross-sectional view of a display device according to an embodiment.

In an embodiment, the display device 10 includes a display panel 100 and a passivation film 200 positioned on a first surface (rear surface) of the display panel 100.

The passivation film 200 includes a first passivation film 210 overlapping the display area DA of the display panel 100, and a second passivation film 220 that is spaced apart from the first passivation film 210 and overlapping the peripheral area PA.

The second passivation film 220 includes a stepped portion 221 overlapping the second bending area BA2 and a flat portion 222 overlapping the second flat area FA2. The stepped portion 221 includes a first portion 221a that is adjacent to the flat portion 222 and a second portion 221b that is adjacent to the first portion 221a. A thickness h6 of the flat portion 222 is greater than a thickness h7 of the first portion 221a of the stepped portion 221, and a thickness h7 of the first portion 221a of the stepped portion 221 is greater than a thickness h8 of the second portion 221b of the stepped portion 221. The stepped portion 221 may have a step shape, and may further include parts having different thicknesses from each other.

Hereinafter, the display device 10 according to another alternative embodiment will be described with reference to FIG. 14.

Figure 14:
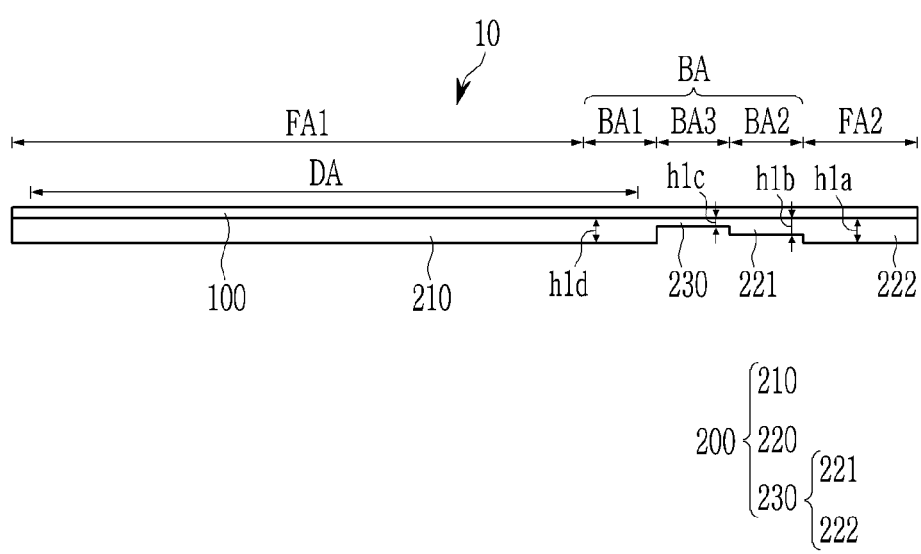
FIG. 14 illustrates a cross-sectional view of a display device according to an embodiment.

FIG. 14 illustrates a cross-sectional view of a display device according to an embodiment.

In an embodiment, the display device 10 includes a display panel 100 and a passivation film 200 positioned on a rear surface of the display panel 100.

The passivation film 200 includes a first passivation film 210 overlapping the first flat area FA1 and the first bending area BA1 of the display panel 100, a second passivation film 220 overlapping the second bending area BA2 and the second flat area FA2, and a third passivation film 230 overlapping the third bending area BA3.

The second passivation film 220 includes a stepped portion 221 overlapping the second bending area BA2 and a flat portion 222 overlapping the second flat area FA2.

A thickness h1b of the stepped portion 221 of the second passivation film 220 is less than a thickness h1a of the flat portion 222 of the second passivation film 220, and a thickness h1c of the third passivation film 230 is less than the thickness h1b of the stepped portion 221 of the second passivation film 220. The thickness h1a of the flat portion 222 of the second passivation film 220 may be substantially the same as a thickness h1d of the first passivation film 210.

Hereinafter, a display device according to another alternative embodiment will be described with reference to FIG. 15 to FIG. 17.

Figure 15:
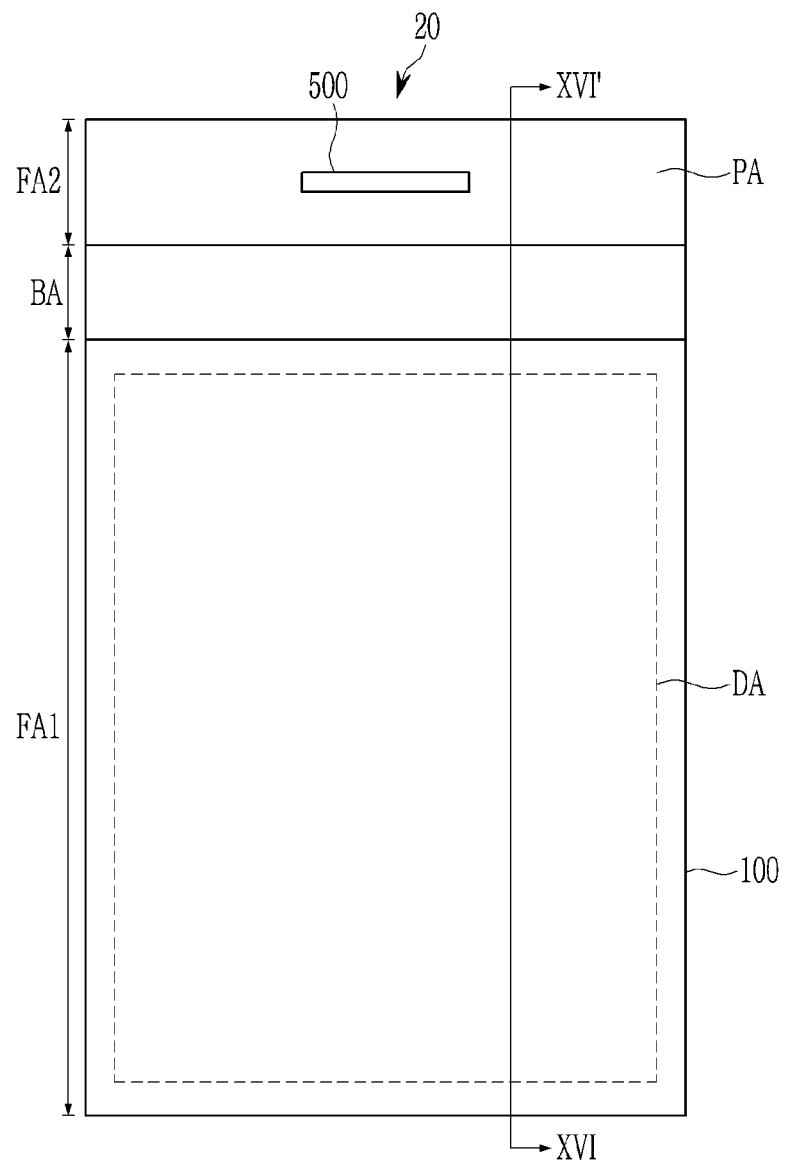
FIG. 15 illustrates a top plan view of a display device according to an embodiment.

FIG. 15 illustrates a top plan view of a display device according to an embodiment. FIG. 16 illustrates a cross-sectional view taken along line XVI-XVI' of FIG. 15. FIG. 17 illustrates a cross-sectional view showing a display device of FIG. 16 in a bent state.

Referring to FIG. 15, an embodiment of the display device 20 includes a display panel 100. The display panel 100 includes a display area DA for displaying an image and a peripheral area PA positioned around the display area DA.

The display area DA of the display panel 100 may include a plurality of pixels, and may include a gate line and a data line connected to the pixels to transfer a signal thereto. The display area DA of the display panel 100 may display an image in a second surface (upper surface) direction of the display panel 100.

A driver 500 is positioned in the peripheral area PA of the display panel 100. The driver 500 may have a form of a COF.

The display panel 100 includes a bending area BA, and a first flat area FA1 and a second flat area FA2 positioned at opposite sides of the bending area BA. The bending area BA may be disposed between the first flat area FA1 and a second flat area FA2. The display panel 100 may be bent in the bending area BA. The display area DA is positioned in the first flat area FA1. The second flat area FA2 is positioned in the peripheral area PA, and the driver 500 is positioned in the second flat area FA2.

Figure 16:
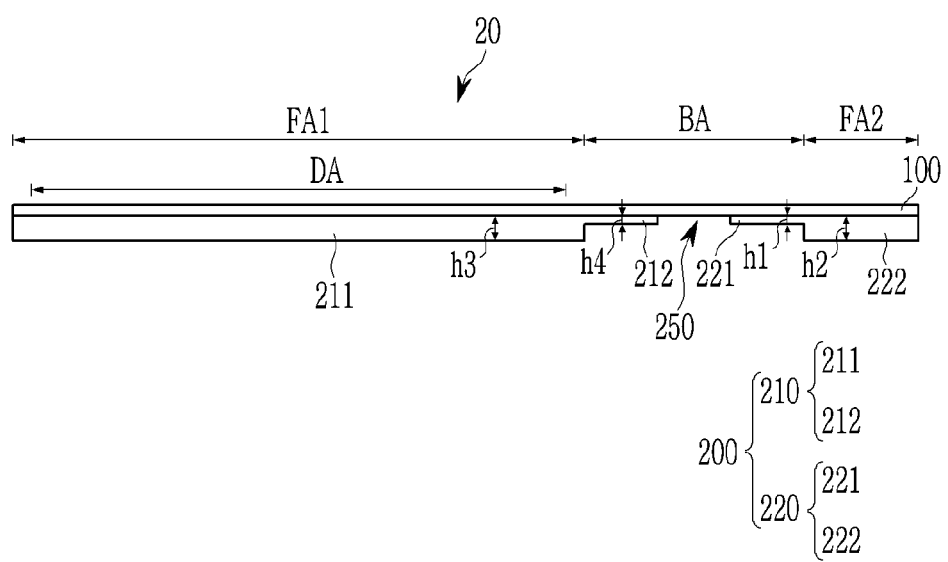
FIG. 16 illustrates a cross-sectional view taken along line XVI-XVI' of FIG. 15.
Figure 17:
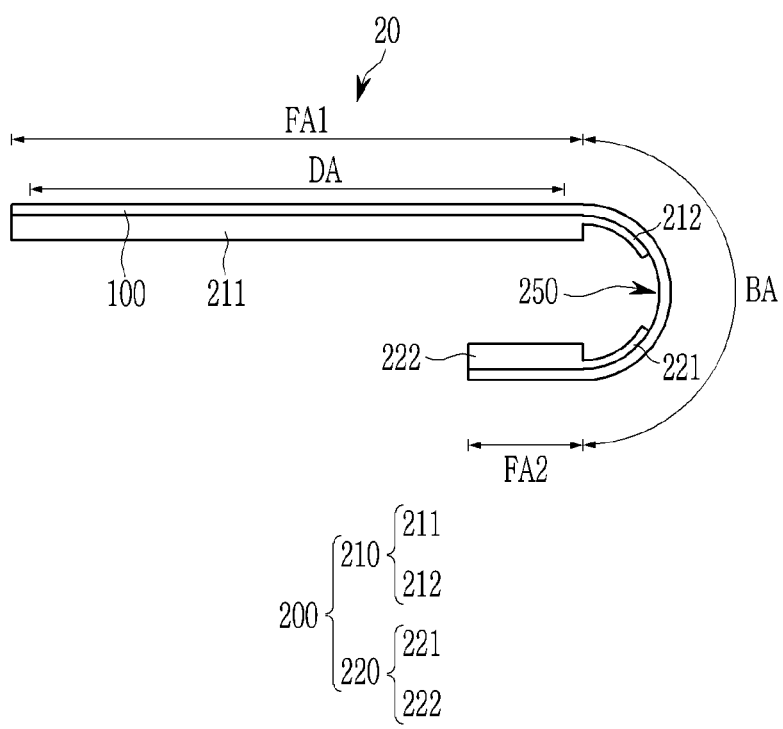
FIG. 17 illustrates a cross-sectional view of a display device of FIG. 16 in a bent state.

Referring to FIG. 16 and FIG. 17, a passivation film 200 is disposed on a first surface (rear surface) of the display panel 100. The passivation film 200 is attached to the first surface of the display panel 100 to prevent foreign substances such as air and moisture from penetrating into display elements from the outside, and to protect the display panel 100 from external impact.

The passivation film 200 includes a first passivation film 210 overlapping the display area DA of the display panel 100, and a second passivation film 220 that is spaced apart from the first passivation film 210 and overlapping the peripheral area PA of the display panel 100.

The first passivation film 210 overlaps the first flat area FA1 and the bending area BA of the display panel 100. The second passivation film 220 overlaps the second flat area FA2 and the bending area BA of the display panel 100. An open portion 250 in which the passivation film 200 is not disposed is defined between the first passivation film 210 and the second passivation film 220.

The second passivation film 220 includes a first stepped portion 221 overlapping the bending area BA and a first flat portion 222 overlapping the second flat area FA2. A thickness h1 of the first stepped portion 221 of the second passivation film 220 is less than a thickness h2 of the first flat portion 222. Upper surfaces of the first stepped portion 221 and the first flat portion 222 are attached to the display panel 100. The upper surface of the first stepped portion 221 attached to the display panel 100 and a lower surface of the first stepped portion 221 facing the upper surface may be parallel to each other or on a same plane.

The first passivation film 210 includes a second stepped portion 212 overlapping the bending area BA and a second flat portion 211 overlapping the first flat area FA1. A thickness h4 of the second stepped portion 212 of the first passivation film 210 is less than a thickness h3 of the second flat portion 211. Upper surfaces of the second stepped portion 212 and the second flat portion 211 are attached to the display panel 100. The upper surface of the second stepped portion 212 attached to the display panel 100 and a lower surface of the second stepped portion 212 facing second upper surface may be parallel to each other or on a same plane.

The bending area BA of the display panel 100 may be bent in a first surface (rear side) direction of the display panel 100 so that the second flat area FA2 may be positioned below the first flat area FA1.

In such an embodiment, the display device 10 may include the first stepped portion 221 and the second stepped portion 212 positioned in the bending area BA adjacent to the first flat area FA1 and the second flat area FA2 to protect the bending area BA adjacent to the first flat area FA1 and the second flat area FA2.

Hereinafter, the display device 20 according to another alternative embodiment will be described with reference to FIG. 18.

Figure 18:
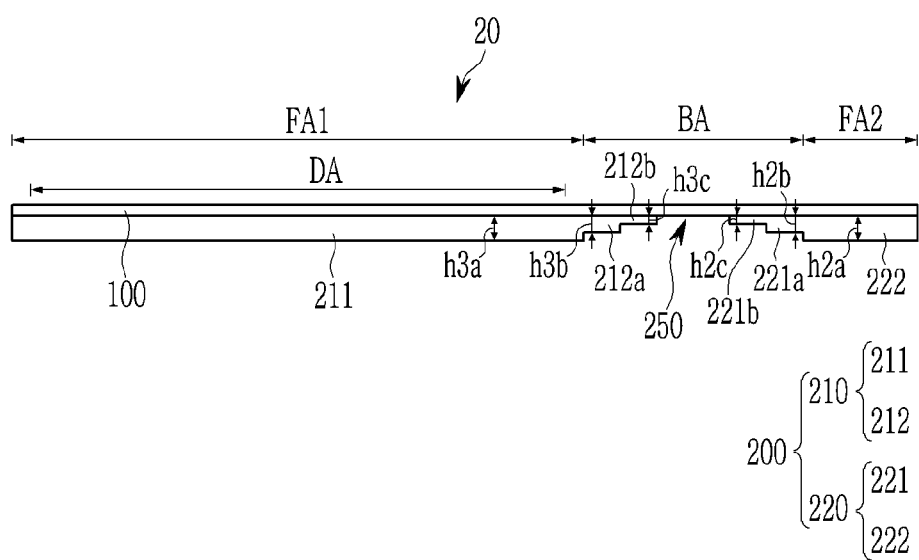
FIG. 18 illustrates a cross-sectional view of a display device according to an embodiment.

FIG. 18 illustrates a cross-sectional view of a display device according to an embodiment.

In an embodiment, the display device 20 includes a display panel 100 and a passivation film 200 positioned on a first surface (rear surface) of the display panel 100.

The passivation film 200 includes a first passivation film 210 that is overlapped with the display area DA of the display panel 100, and a second passivation film 220 that is spaced apart from the first passivation film 210 and overlaps the peripheral area PA.

The second passivation film 220 includes a first stepped portion 221 overlapping the second bending area BA2 and a first flat portion 222 overlapping the second flat area FA2. The first stepped portion 221 includes a first portion 221a that is adjacent to the first flat portion 222 and a second portion 221b that is adjacent to the first portion 221a. A thickness h2a of the first flat portion 222 is greater than a thickness h2b of the first portion 221a of the first stepped portion 221, and the thickness h2b of the first portion 221a of the first stepped portion 221 is greater than a thickness h2c of the second portion 221b of the first stepped portion 221. The first stepped portion 221 may have a step shape, and may further include parts having different thicknesses from each other.

The first passivation film 210 includes a second stepped portion 212 overlapping the bending area BA and a second flat portion 211 overlapping the second flat area FA2. The second stepped portion 212 includes a first portion 212a that is adjacent to the first flat portion 222 and a second portion 212b that is adjacent to the first portion 221a. A thickness h3a of the second flat portion 211 is greater than a thickness h3b of the first portion 221a of the second stepped portion 212, and the thickness h3b of the first portion 221a of the second stepped portion 212 is greater than a thickness h3c of the second portion 212b of the second stepped portion 212. The second stepped portion 212 may have a step shape, and may further include parts having different thicknesses from each other.

Hereinafter, the display device 20 according to another alternative embodiment will be described with reference to FIG. 19.

Figure 19:
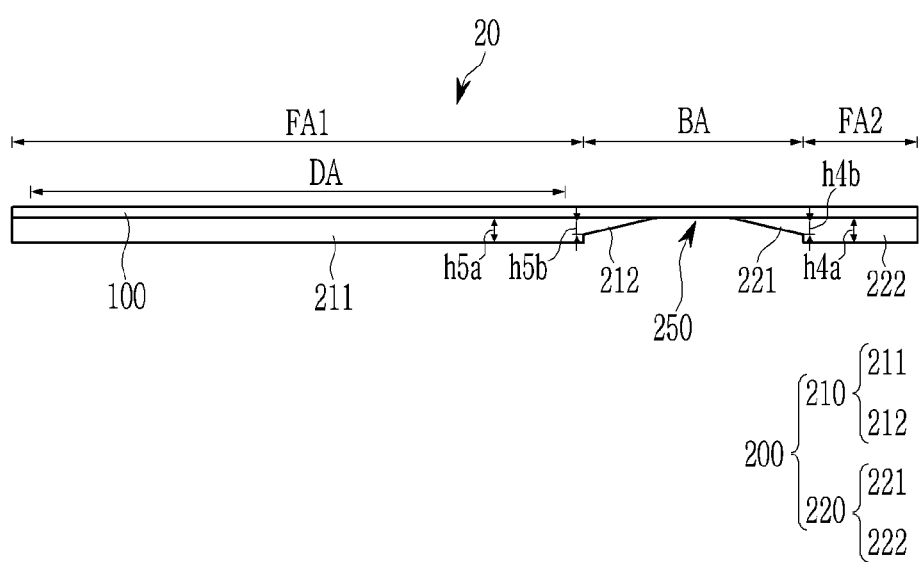
FIG. 19 illustrates a cross-sectional view of a display device according to an embodiment.

FIG. 19 illustrates a cross-sectional view of a display device according to an embodiment.

In an embodiment, the display device 20 includes a display panel 100 and a passivation film 200 positioned on a first surface (rear surface) of the display panel 100.

The passivation film 200 includes a first passivation film 210 overlapping the display area DA of the display panel 100, and a second passivation film 220 that is spaced apart from the first passivation film 210 and overlapping the peripheral area PA.

The second passivation film 220 includes a first stepped portion 221 overlapping the second bending area BA2 and a first flat portion 222 overlapping the second flat area FA2. The lower surface of the first stepped portion 221 includes an inclined surface that is inclined with respect to the first surface (rear surface) of the display panel 100. A thickness of the first stepped portion 221 may gradually decrease from a portion adjacent to the first flat portion 222 to a portion adjacent to the bending area BA.

A maximum thickness h4b of the first stepped portion 221 is less than a thickness h4a of the first flat portion 222. The display panel 100 may be protected and the stress applied to the display panel 100 may be reduced during bending by allowing the first stepped portion 221 of the second passivation film 220 to be inclined in an area overlapping the bending area BA.

The first passivation film 210 includes a second stepped portion 212 overlapping the second bending area BA2 and a second flat portion 211 overlapping the second flat area FA2. The lower surface of the second stepped portion 212 includes an inclined surface that is inclined with respect to the first surface (rear surface) of the display panel 100. A thickness of the second stepped portion 212 may gradually decrease from a portion adjacent to the second flat portion 211 to a portion adjacent to the bending area BA.

A maximum thickness h5b of the second stepped portion 212 is less than a thickness h5a of the second flat portion 211. The display panel 100 may be protected and the stress applied to the display panel 100 may be reduced during bending by allowing the second stepped portion 212 of the first passivation film 210 to be inclined in an area overlapping the bending area BA.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a display panel including a first flat area, a second flat area, and a bending area between the first flat area and the second flat area; and
a first passivation film and a second passivation film, which are disposed on a first surface of the display panel to be spaced apart from each other,
wherein the first passivation film overlaps the first flat area and the second passivation film overlaps the second flat area,
the first passivation film has a first end portion overlapping the bending area, and the second passivation film has a second end portion overlapping the bending area and spaced apart from the first end portion,
the first end portion and the second end portion are asymmetric with each other with respect to an imaginary line vertically crossing a center of a space therebetween in a cross-sectional view,
an overall shape of the first end portion and the second end portion in the bending area is asymmetrical with respect to the imaginary line, and
an open portion is defined between the first passivation film and the second passivation film to expose the display panel.

2. The display device of claim 1, wherein
at least one of the first end portion and the second end portion includes an inclined surface which is inclined with respect to the first surface of the display panel.

3. The display device of claim 2, wherein
a width of the inclined surface is greater than a thickness of the first passivation film or the second passivation film in a cross-sectional view.

4. The display device of claim 2, wherein
a length of the inclined surface is more than twice a thickness of the first passivation film or the second passivation film in a cross-sectional view.

5. The display device of claim 2, wherein
the first end portion includes the inclined surface, and
a thickness of a portion with the inclined surface in the first end portion is less than a thickness of the first passivation film or the second passivation film in a cross-sectional view.

6. The display device of claim 1, wherein
the open portion is formed by laser irradiation.

7. The display device of claim 1, wherein
the bending area includes:
a first bending area adjacent to the first flat area;
a second bending area adjacent to the second flat area; and
a third bending area between the first bending area and the second bending area.

8. The display device of claim 7, wherein
the first bending area extends from the first flat area to bend in a first direction,
the second bending area extends from the second flat area to bend in the first direction, and
the third bending area is bent to connect the first bending area and the second bending area.

9. The display device of claim 8, wherein
the display panel further includes a fourth bending area extending from the first flat area and bending in the first direction.

10. The display device of claim 7, wherein
the first end portion overlaps the first bending area, the second end portion overlaps the second bending area, and the open portion overlaps the third bending area.

11. The display device of claim 1, wherein
the second passivation film includes a first flat portion overlapping the second flat area and a first stepped portion overlapping the bending area, and
a thickness of the first stepped portion is less than a thickness of the first flat portion.

12. The display device of claim 11, wherein
the first stepped portion includes an inclined surface which is inclined with respect to the first surface of the display panel.

13. The display device of claim 11, wherein
the first passivation film includes a second flat portion overlapping the first flat area and a second stepped portion overlapping the bending area, and
a thickness of the second stepped portion is less than a thickness of the second flat portion.

14. The display device of claim 13, wherein
the second stepped portion includes an inclined surface, which is inclined with respect to the first surface of the display panel.

15. The display device of claim 1, further comprising:
a window disposed on the display panel.

16. The display device of claim 1, further comprising:
a protective cover disposed on the first surface of the display panel with the first passivation film and the second passivation film interposed therebetween,
wherein the protective cover includes a protrusion disposed in the open portion.

17. The display device of claim 1, further comprising:
a bendable portion passivation layer disposed on a second surface of the display panel opposite to the first surface, the bendable portion passivation layer overlapping the bending area.

* * * * *